US007693670B2

(12) United States Patent
Durling et al.

(10) Patent No.: US 7,693,670 B2
(45) Date of Patent: Apr. 6, 2010

(54) COGNITIVE ELECTRIC POWER METER

(75) Inventors: Michael Richard Durling, Saratoga Springs, NY (US); Zhiyuan Ren, Malta, NY (US); Nikita Visnevski, Niskayuna, NY (US); Lauren Elizabeth Ray, Clifton Park, NY (US)

(73) Assignee: General Electric Company, Niskayuna, NY (US)

( * ) Notice: Subject to any disclaimer, the term of this patent is extended or adjusted under 35 U.S.C. 154(b) by 297 days.

(21) Appl. No.: 11/893,170

(22) Filed: Aug. 14, 2007

(65) Prior Publication Data

US 2009/0045804 A1 Feb. 19, 2009

(51) Int. Cl.
*G01R 21/00* (2006.01)
*G01R 21/06* (2006.01)

(52) U.S. Cl. .......................... 702/62; 702/61; 700/291; 706/906; 706/915

(58) Field of Classification Search .................. 702/61, 702/62; 700/291; 706/906, 915
See application file for complete search history.

(56) References Cited

U.S. PATENT DOCUMENTS

| | | | | |
|---|---|---|---|---|
| 4,858,141 | A | 8/1989 | Hart et al. | 364/483 |
| 5,483,153 | A | 1/1996 | Leeb et al. | 324/76.12 |
| 5,566,084 | A * | 10/1996 | Cmar | 700/276 |
| 5,696,695 | A * | 12/1997 | Ehlers et al. | 700/286 |
| 5,910,875 | A | 6/1999 | Tian et al. | 361/78 |
| 6,081,123 | A | 6/2000 | Kasbarian et al. | 324/521 |
| 6,529,839 | B1 * | 3/2003 | Uggerud et al. | 702/61 |
| 6,816,078 | B2 | 11/2004 | Onoda et al. | 340/658 |
| 6,850,735 | B2 | 2/2005 | Sugar et al. | 455/67.11 |
| 6,937,946 | B1 * | 8/2005 | Culp et al. | 702/62 |
| 2003/0097348 | A1 * | 5/2003 | Cao | 706/12 |
| 2008/0065760 | A1 * | 3/2008 | Damm et al. | 709/224 |

FOREIGN PATENT DOCUMENTS

| | | |
|---|---|---|
| EP | 1136829 | 9/2001 |
| GB | 2235304 | 2/1991 |

OTHER PUBLICATIONS

Enetics, Inc. brochure, "Single Point End-use Energy Disaggregation (SPEED™)" @http://www.enetics.com/downloads/SPEED%20Brochure.pdf (6 pages).
EP 08161952 Search Report, Nov. 12, 2008.

* cited by examiner

*Primary Examiner*—Hal D Wachsman
*Assistant Examiner*—Janet L Suglo
(74) *Attorney, Agent, or Firm*—Ann M. Agosti

(57) ABSTRACT

An electric power meter includes an embedded decomposition module that is configured to decompose a power meter signal into constituent loads to segregate and identify energy consumption associated with each individual energy consumption device within a plurality of energy consumption devices coupled to the power meter.

77 Claims, 6 Drawing Sheets

My Utility Company

20

*Next reading/estimate:*
12865 Thrs. Aug 24, 2006

Electric Service
This meter reading, Jul 25 (Actual)................. 32821
Last meter reading, Jun 22 (Actual)................. : 30685
Amount of electricity used..........................KWH 2136

Current charges for 33 Days
Electric SC1 Heat

National Grid Electricity Delivery Charges

| | | |
|---|---|---|
| Basic service (not including usage)...................... | $ | 10.49 |
| Delivery 2136 kWh @ 3.5378¢ .......................... | $ | 75.56 |
| Delivery Adj 2136 kWh @ 1.71100¢ ................. | $ | 36.55 |
| SBC/RPS Adj 2136 kWh @ 0.181329¢ .............. | $ | 3.87 |
| Trans Rev Adj 2136 kWh @ 0.16200¢ ............... | $ | 3.25 |
| Tariff Surcharge (3.09278 %) ........................ | $ | 4.01 |
| Total NO Electricity Delivery Charges ................ | $ | 133.73 |

Electricity Supply Charges

Supplier+National Grid– You can shop for this part of your services. Pick another supplier and you will be charged their rate, and any applicable taxes.

| | | |
|---|---|---|
| Electricity Supply 2136 KWh @ 7.5890¢ ......... | $ | 152.10 |
| Total Surcharge (1.010101 %) ............................ | $ | 1.64 |
| Total Charges for Electricity Supply .................... | $ | 153.74 |

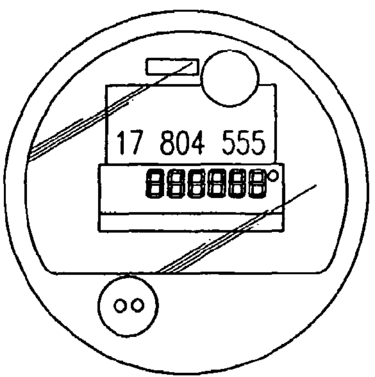

Your energy use and cost

Chart(s) shows your energy use pattern over the last 13 months.

||||= *Actual reading*
▦ = *Estimated reading*

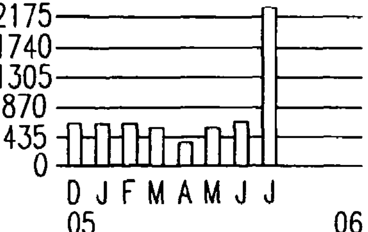

Tomorrow's Electric Bill

| | Actual | Last Month Actual | Last Year Actual | Regional Average | DoE Goal |
|---|---|---|---|---|---|
| Air Conditioning | 2000 | 1000 | 1500 | 1800 | 1200 |
| De Humidifier | 150 | 125 | 0 | 25 | 20 |
| General Purpose Lighting | 100 | 110 | 95 | 85 | 40 |
| Heating | 0 | 0 | 0 | 0 | 0 |
| Hot Tub | 75 | 700 | 775 | 800 | 550 |
| Hot Water | 800 | 750 | 950 | 600 | 500 |
| Microwave Oven | 75 | 50 | 68 | 50 | 28 |
| Miscellaneous | 25 | 26 | 24 | 21 | 15 |
| Oven | 66 | 64 | 68 | 62 | 55 |
| Pumps | 95 | 95 | 90 | 87 | 65 |
| Refrigerator | 125 | 110 | 75 | 65 | 55 |
| Stove | 29 | 43 | 37 | 37 | 27 |
| Television | 65 | 85 | 66 | 67 | 50 |
| Total | 3605 | 3138 | 3748 | 3699 | 2605 |

Page 3

COGNITIVE ELECTRIC POWER METER

BACKGROUND

This invention relates generally to the field of energy consumption metering, and more specifically to a cognitive electric power meter having embedded intelligence to decompose metered current and voltage signals into specific constituent energy consumption.

As the cost of energy/electricity continues to increase, consumers are becoming more conscious of their consumption and more thoughtful in terms of sustainable energy planning. People are buying more cars that get higher fuel mileage, for example, including both smaller and hybrid electric cars.

In order for people to use less energy/electricity in their homes, they need an itemized bill that clearly shows their usage and energy cost for each of their appliances. With itemized data, consumers can take action to conserve, by either installing more energy efficient appliances (air conditioners, cloths washers/dryers, hot tubs, ovens, lighting, etc), or changing their usage patterns in areas where pricing of energy/electricity varies by time of day, or simply turning loads off when not in use. The problem is that people do not want to incur the significant expense required to install power sensors on each of their appliances and electric loads.

One technique of decomposing the power signal measured at the incoming power meter into its constituent individual loads is known as Single Point End-use Energy Disaggregation (SPEED™), and is available from Enetics, Inc. of New York. The SPEED™ product includes logging premises load data and then transferring the data via telephone, walk-ups, or alternative communications to a Master Station that processes the recorder data into individual load interval data, acts as a server and database manager for pre and post processed energy consumption data, temperature data, queries from analysis stations, and queries from other information systems. This known technique runs on a Windows® operating system.

Although known decomposition techniques have succeeded in improving the quality of services related to consumer energy consumption, a need still exists for a more comprehensive electric power meter that does not require a Master Station and/or additional people resources to decompose an electric power meter signal into its constituent individual loads.

In view of the foregoing, it would be both beneficial and advantageous to provide an electric power meter that employs embedded intelligence to decompose the power signal that is already measured at the incoming meter into its constituent individual loads and to provide a usage summary to the consumer with no in home field installation cost.

BRIEF DESCRIPTION

Embodiments of the present invention are directed to a cognitive electric power meter and method for decomposing an input power signal measured at the input of the electric power meter into its constituent individual loads without incurring home field installation costs, to allow provision of a detailed usage summary to a consumer. One embodiment is directed to an electric power meter comprising:

at least one sensor configured to, measure at least one desired energy consumption variable associated with a plurality of energy consumption devices, and to generate at least one output signal therefrom; and a decomposition module configured to decompose the at least one output signal into constituent individual loads and therefrom identify energy consumption corresponding to each energy consumption device within the plurality of energy consumption devices.

Another embodiment of the present invention is directed to a method of decomposing a household power meter signal, the method comprising:

measuring a household meter power line signal;

decomposing within the household power meter, the power line signal into constituent individual loads; and identifying within the household power meter, energy consumption corresponding to each individual load within a plurality of loads that operate together to generate the household meter power line signal.

Yet another embodiment of the present invention is directed to an electric power meter comprising an embedded decomposition module configured for decomposing a power signal into constituent loads to segregate and identify energy consumption associated with each individual energy consumption device within a plurality of energy consumption devices.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein:

FIG. 2 illustrates a typical current electric bill;

While the above-identified drawing figures set forth alternative embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION

Figure 1:
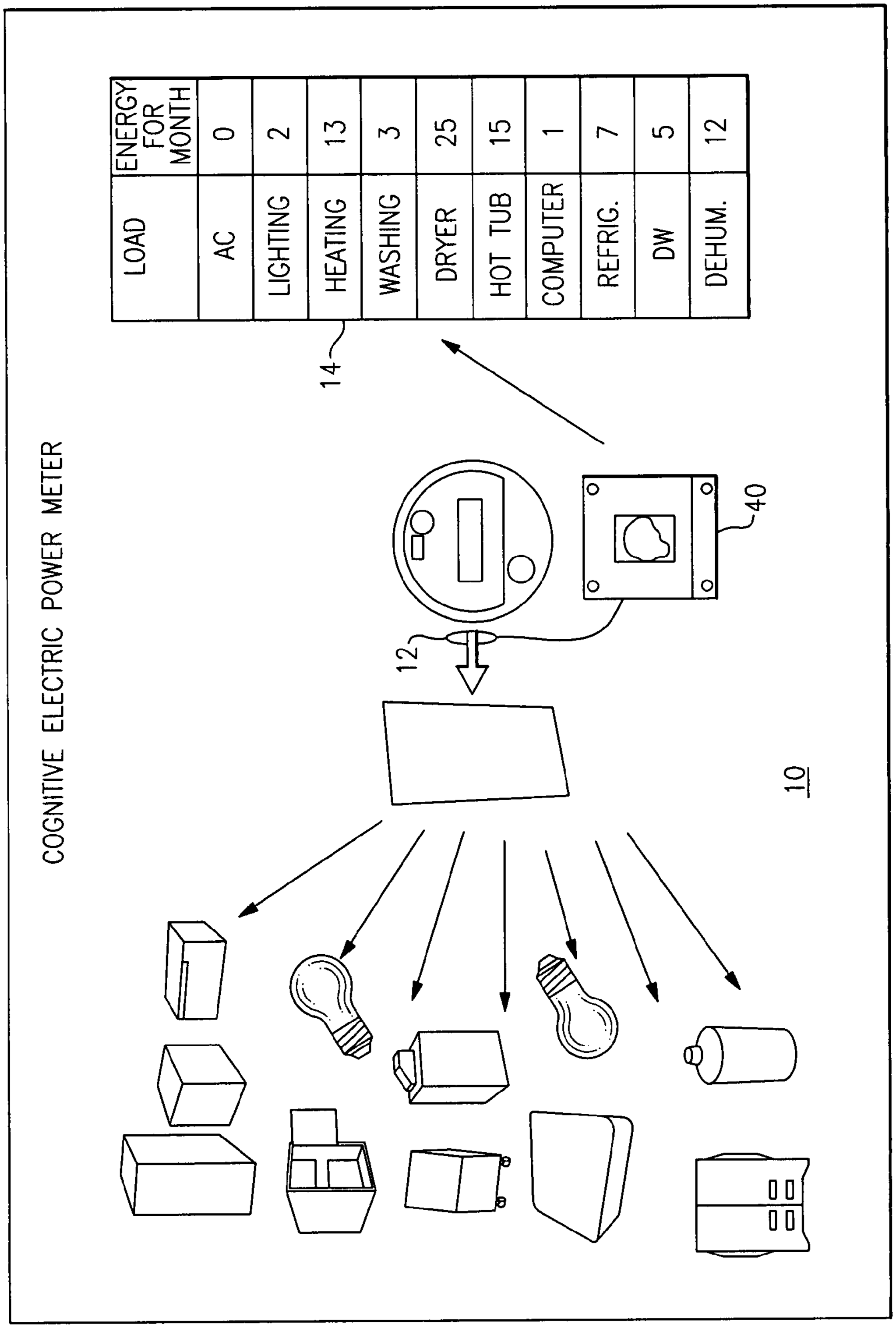
FIG. 1 is a pictorial diagram illustrating use of a cognitive electric power meter having embedded intelligence to decompose one measured load signal into its constituents, according to one embodiment.

FIG. 1 is a pictorial diagram illustrating use of a cognitive electric power meter 10 having embedded intelligence 40 to decompose one measured load signal 12 into its constituents 14, according to one embodiment. The cognitive electric power meter 10 uses model based embedded intelligence to decompose the power signal that is already measured at the incoming meter 10 into its constituent individual loads and provides a usage summary to the consumer with no in home field installation cost. The cognitive electric power meter functionality, in one embodiment, is built in to the residential electric power meter 10.

The cognitive electric power meter 10 allows a power utility provider to provide the consumer with a detailed electric bill showing all of their individual loads usage, without requiring installation of invasive and expensive sensors on each of the branch circuit loads. This provides the consumer with a first order and persistent energy audit each month. It will help the consumer know where they are spending their money on electricity, and may drive conservation, maintenance, or appliance upgrade decisions.

The cognitive electric power meter 10, described in further detail below according to one embodiment, collects large volume data, converts the large volume data to small data volume information, and communicates the information to a larger information system to provide a system that is practical and scalable to large numbers of customers. The power meter 10, in one embodiment, forms part of an intelligent billing system and is integrated into the revenue meter.

The cognitive electric power meter 10 can include data fusion from multiple diverse sensors such as time, date, temperature, security system, TV, computer network, and the like to provide enhanced load definitions, and does not require field training of parameters to generate desired results. The power meter 10, in one embodiment, is configured to communicate directly with smart appliances over a power line carrier, a wireless link, or other suitable communication means.

Figure 3:
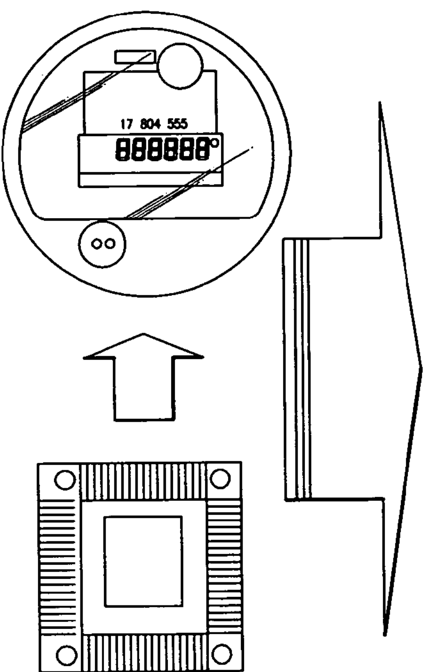
FIG. 3 illustrates a future itemized electric bill according to one embodiment.

FIG. 2 illustrates a typical current consumer electric bill 20; while FIG. 3 illustrates an itemized electric bill 30 according to one embodiment when using the cognitive electric power meter 10 having embedded intelligence 40. The typical bill 20 simply shows the difference between the meter reading at the beginning and end of the month to calculate total energy consumption, and then provides a comparison to last year's bill for the similar period. The itemized bill 30 provides an estimate for each of the electric loads typically found in people's homes, a comparison to their local peers for the same period, the national average and the Department of Energy goal. This bill 30 can serve as a first order energy audit that will enable consumers to make better decisions about investing in new more efficient technology.

The itemized electric bill 30 can also include, for example, recommendations on how a consumer may save money, one example being a recommendation on the consumer's bill to install a timer if the consumer has a swimming pool pump that is continuously energized. Further, the timer should be programmed so that the pool pump is running during off peak hours so the consumer would benefit from the lower cost of energy. The consumer would use less energy and purchase the energy at the lowest possible rate in the foregoing scenario. The utility would also benefit in terms of shedding non-essential loading during peak demand times.

Figure 4:
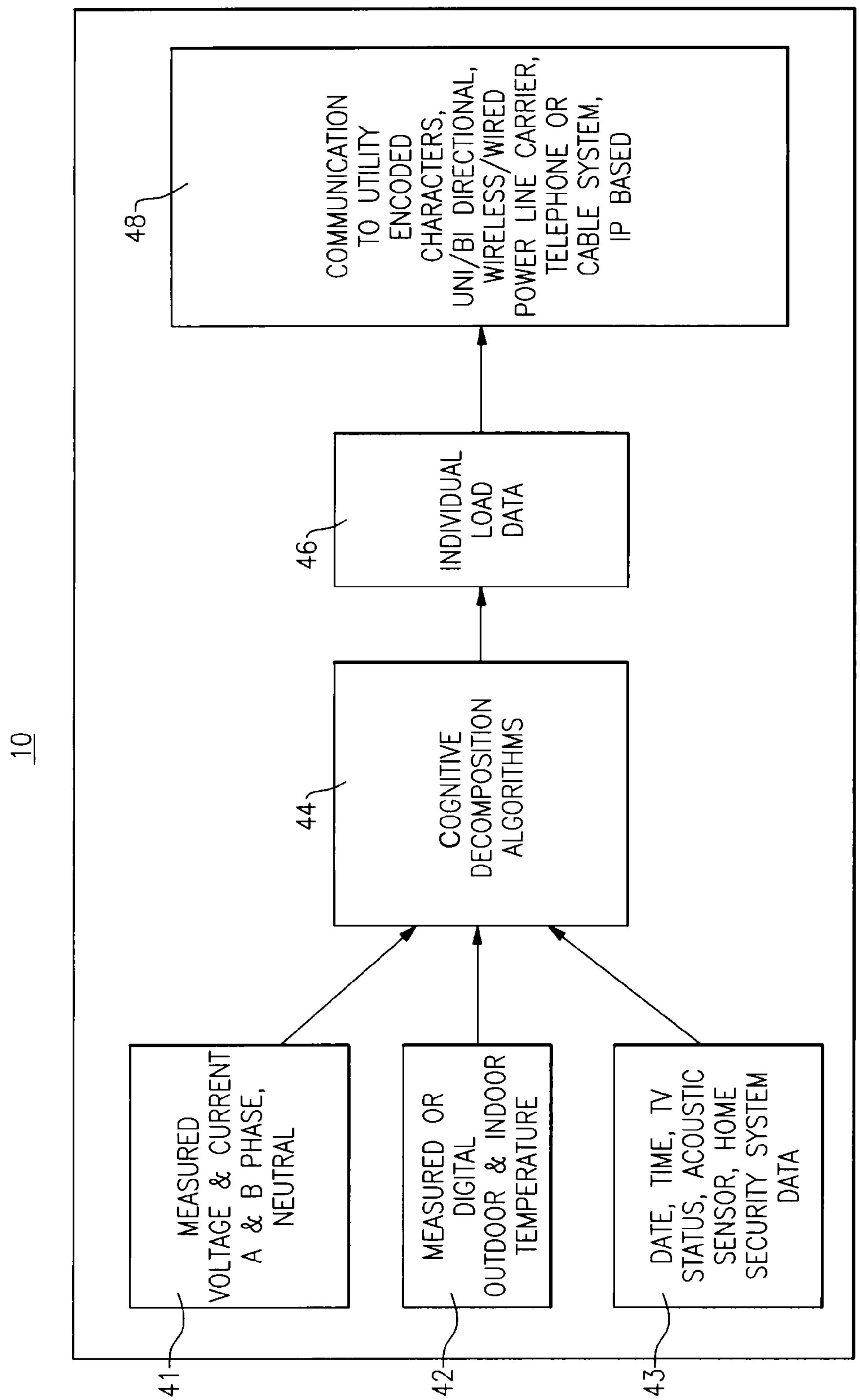
FIG. 4 is a flow chart illustrating an embedded system and method for decomposing a measured load signal into its constituents, according to one embodiment.

The cognitive electric power meter 10 may be logically broken down into four components as illustrated in FIG. 4 that shows a system and method, according to one embodiment, for decomposing a measured load signal into its constituents. The system includes: 1) input data sensing 41, 42, 43; 2) the cognitive decomposition algorithms 44; 3) the estimated individual load data/information 46; and 4) the communications interface 48.

Input/Sensing: The input data, in one embodiment, is comprised of the measured voltage and current from the A phase, B phase and neutral wires, as shown in block 41. The A and B phase voltages may be measured from A to neutral, B to neutral and from A to B. Once the voltage and current measurements are taken, harmonics, power factor, derivatives, and other synthetic instruments may be calculated and used as inputs to the cognitive decomposition algorithm.

Indoor and outdoor temperatures, as shown in block 42, can also be utilized in one embodiment, in addition to the voltage and current measurements. The temperature measurements may be taken directly from local sensors or may be communicated digitally to the meter, for example, by radio, wire, or IP network. The temperature data may come from the homes HVAC system, cable TV, a website or other source. The temperatures may be used by the cognitive decomposition algorithm to more accurately estimate, for example, heat and cooling loads, or pool pump loads.

The time of day and date, as shown in block 43, can also be used as inputs to the cognitive decomposition algorithm. This information may also come from multiple sources including radio, wire, IP network, or other means. The date and time data can be used to help reduce error and simplify the cognitive decomposition algorithms.

The cognitive algorithms may also receive input data from a cable TV system that indicates TV activity, and a computer network that indicates computer activity, as shown in block 43.

Acoustic sensors, and ties to in home security systems data, as shown in block 43, may also be used as inputs to the cognitive algorithms.

Decomposition Algorithms/Cognition: Cognitive electronic systems can be employed to aggregate distributed intelligence at the large-scale enterprise level, the system level and the device level. An intelligent power meter is one example of a device level intelligent system that is capable of supporting system level interfacing (e.g. microgrid) as well as large-scale enterprise-level interfacing (power distribution network).

With continued reference to FIG. 4, the input sensing portions 41, 42, 43, decomposition module portion 44, individual load data portion 46 and communication interface portion 48 together in one embodiment forms a revenue metering portion of the electric power meter 10. Individual load data in one embodiment is processed in block 46 to link washing, air conditioning and dishwashing activities to time of use pricing based on data generated by the decomposition algorithms 44. The revenue metering portion can further be configured to identify an appliance that is using more energy than the national average energy usage for the appliance based on data generated by the decomposition algorithms 400 and/or configured to identify a wiring flaw within a home using the electric power meter based on data generated by the decomposition module algorithms 44.

Figure 5:
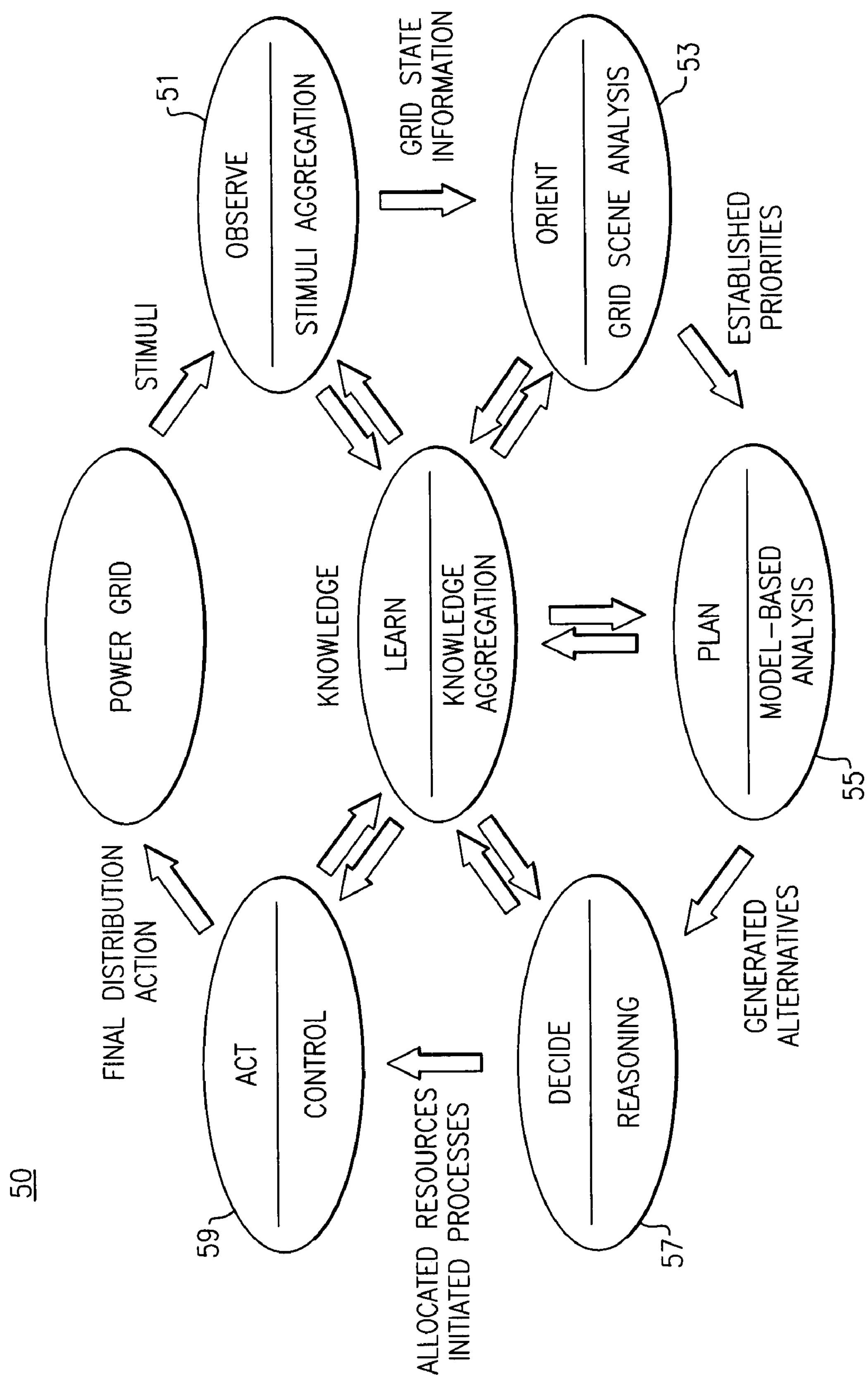
FIG. 5 is a flow diagram illustrating a cognitive operating cycle according to one embodiment.

FIG. 5 is a flow diagram illustrating a cognitive operating cycle 50 according to one embodiment. Specific elements 51, 53, 55, 57, 59 of the cognitive cycle 50 shown in FIG. 5 are based, in one embodiment, on the following principles:

Observe element 51: The cognitive electric power meter 10 senses voltages and currents in the power line with the objective of determining the instantaneous state of the line. This includes power load signature detection and preliminary classification. The result is a set of features, data and metadata that describe the current state of the power line.

Orient element 53: The grid state observations are then analyzed further at a higher level using the previous knowledge accumulated by the meter 10. This is referred to as grid scene analysis and includes actual identification of individual and combined load signatures of power consuming systems such as household appliances. The data of interest may be analyzed over multiple time scales from instantaneous values to identify loads turning on and off to hourly, daily, monthly, and yearly scales to observe longer time scale cycles and trends. A laundry cycle, for example, may take multiple hours to observe a weekly pattern of doing laundry.

Plan element 55: Bayesian models of the grid, in one embodiment, are constructed and dynamically updated on the fly with the goal of obtaining predictions about the power grid behavior. For example, if a washing machine has been activated, given the knowledge of the type of this machine and/or knowledge of its operation derived from previous observations, a very accurate predictive model of power line load dynamics can be constructed for the duration of the operation of this device.

Decide element 57: Bayesian inference and probabilistic reasoning is used at this stage to make a decision about the state of the household power line. A simple decision may involve flagging metadata associated with a specific power-consuming device as an irregular or an excessive load. More sophisticated decisions may involve a recommendation to the homeowner to adjust the power setting or time of operation with justification of the cost saving. Furthermore, subject to user's approval, some decisions supporting control functionality can be enabled (optimal control strategy of an AC unit, water heater, etc. that is based on the consumer behavior patterns).

Act element 59: The final stage of the cognitive cycle 50 involves final actions of the cognitive electric power meter 10 that can range, for example, from generating a report containing power usage statistics, flagging certain parts of the report as abnormal or excessive loads, generating recommendations for improvements in power usage, and even active control of the household devices.

A feature of the cognitive cycle 50 is the power meter's 10 capability to store knowledge and learn, continuously adapting to the changes in the household and improving power monitoring and control capabilities. Invariant representation and associative processing are the key mechanisms of learning, according to one embodiment, within the cognitive meter 10. The knowledge in the meter 10 is aggregated in a multi-dimensional associative array W that is segmented based on the particular element of the cognitive cycle it supports. Each stage 51, 53, 55, 57, 59 of the cycle 50 will have its own segment of the associative array W allocated for it. The knowledge is represented by a set of weights $w_i$ that is each supporting an i-th stage of the cycle 50. These weights are continuously updated using a reinforcement learning mechanism with the cost function Q representing the total power consumption of the household. The final objective of the cognitive power meter 10 as a whole is to suggest a power consumption strategy; so knowledge is built over time by reinforcing the weights of the associative array W so as to minimize the total power consumption in the household. Each stage of the cognitive cycle 50 can both aggregate and extract knowledge from the associative array. Aggregation can occur in the segment of the array W allocated to the corresponding cognitive cycle stage 51, 53, 55, 57, 59. Extraction of knowledge, however, can be done from the entire associative array W by any stage of the cognitive cycle 50.

Figure 6:
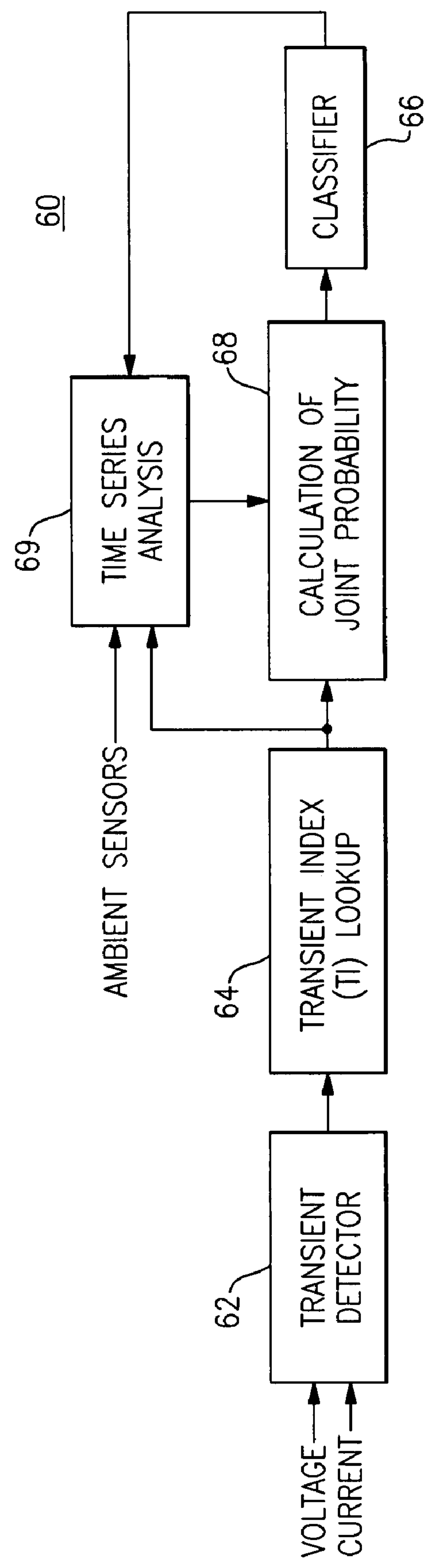
FIG. 6 is a flow diagram illustrating a decomposition algorithm suitable to provide embedded intelligence for the cognitive electric power meter depicted in FIG. 1, according to one embodiment.

A Bayesian-inference based classifier 60 can be used, for example, for the decomposition algorithm. The basic flow of the algorithm, according to one embodiment, is shown in FIG. 6 that is a flow diagram illustrating a decomposition algorithm 60 suitable to provide embedded intelligence for the cognitive electric power meter 10 depicted in FIG. 1, according to one embodiment.

Transient detector 62 senses voltage and current, detects and records transient patterns including voltage and current amplitude, before and after differential, harmonics, phase, and other parameters designated to model a transient. Transient index lookup block 64 obtains a transient index, $TI_m$, from a pre-programmed lookup table of transient patterns $TI_0, TI_1, \ldots TI_M$.

Let $A_0, A_1, \ldots, A_N$ denote, for example, a group of usual appliances in a household. By doing offline lab experiment, a conditional probability $Pr(TI_m/A_n)$, the likelihood that turning on and off appliance An produces transient pattern $TI_m$, can be obtained for all m and n and pre-programmed into the smart meter 10.

Once a transient pattern TI is observed, the Bayesian classifier 66 chooses the appliance with the maximum joint probability $Pr(TI, A_n)$ that essentially maximizes the posterior probability $Pr(A_n|TI)$ describing the likelihood of $A_n$ being the appliance producing an observed transient pattern TI.

To calculate the joint probability $Pr(TI, A_n)=Pr(A_n)Pr(TI/A_n)$ 68 for the classifier, one only needs to obtain $Pr(A_n)$ since $Pr(TI/A_n)$ is available from offline experiment. According to one embodiment, one can rely on time series analysis 69 to get an approximation of $Pr(A_n)$. The basic idea is that by looking at the historical series of time epochs regarding turning on and off events of each individual appliance and ambient sensor information, to obtain a probability distribution for the time of the next event for each appliance. Given the occurrence of an event (transient pattern), probability density (from the aforementioned probability distribution) $PD(A_n)$ for the occurrence time of this event can be obtained for each appliance. $Pr(A_n)$ is calculated as a probability density weight $PD(A_n)/(PD(A_0)+PD(A_1)+ \ldots +PD(A_N))$.

This algorithm 60 is essentially a two-layer inference refinement in which the first layer, at occurrence of a transient pattern, relies on time series analysis 66 to infer prior probabilities and second layer refines that inference with detailed information on that transient pattern via transient detector 62 and transient index 64.

Embedded System: The embedded module 40 (depicted in FIGS. 1 and 3), in one embodiment, includes the following subsystems: 1) sensors including basic voltage sensing and voltage-shunt or hall-effect based current sensing; additional ambient environmental sensors including capacitive, resistive, and thermal conductivity-based temperature and humidity sensors, and microphones for acoustic sensing. These sensors are widely available commercially and a voltage interface is readily available or can be obtained with minimum surrounding circuits; 2) sensor conditioning including filtering and other desired pre-processing of sensory signals. This can be done with either analog circuits or digital processing if sampling of the analog to digital converter (ADC) guarantee an adequate Nyquist frequency; 3) signal sampling and processing, which may include a general purpose ADC, an application-specific integrated circuit (ASIC), and a digital signal processor (DSP). This subsystem computes the necessary input/sensing information needed for the decomposition algorithm; 4) general purpose processor in charge of system management, time keeping, logging/storage and interfaces. The decomposition algorithm can be implemented on either the DSP or the general purpose processor. Subsystems 3) and 4) can be combined and realized with a single DSP or processor with built in ADC's; and 5) communication transceivers for receiving user commands/queries and transmitting decomposition results and other useful information. Wired and wireless communication technologies are widely available including but not limited to RS232/USB/Firewire, Ethernet, Zigbee, Wifi, Bluetooth, RFID, wireless USB, cellular/WMAN, etc.

In an alternative implementation, a single FPGA could be used to implement all digital acquisition functions and the cognitive usage analysis algorithms. Soft processors in the FPGA could be used to handle traditional communications and data acquisition tasks, while a Scouting hardware methodology could be used for the non-deterministic usage algorithms. Scouting is a high-speed technique used to solve NP-complete problems using multiple copies of hardware that can be readily synthesized into FPGA hardware. This technique could provide a low-cost methodology for implementing the searching algorithms required in the power meter 10 without resorting to Bayesian calculations performed on more expensive DSP hardware.

Furthermore, processing speed can be adjusted by controlling the number of Scouts synthesized into the FPGA. Providing a good trade between cost and performance is therefore achievable. The power assignment problem is a variation of the knapsack problem, a well-known NP-complete problem that has already been shown to be susceptible to Scouting-based solution techniques.

Individual Load Data: The individual load data (46 in FIG. 4), in one embodiment, is formatted into histogram bins with titles such as air conditioning, heating, clothes washing machines, cloths dryers, pool pumps, hot tubs, lighting, consumer electronics (clocks, radios, video games, etc), televisions, oven, stove, refrigerator, computers, printers, de humidifiers, coffee makers, hair dryers and curlers, etc. Each histogram bin, according to one embodiment, will include usage for the measured time period, peak loads, average loads, and a probabilistic metric for correctness.

Output/Information Communications: The information output from the Cognitive Electric Power Meter (CEPM) 10, in one embodiment, will be read by the utility and then incorporated into the consumer's bill. The CEPM 10 includes more information than that which is typically included in a modern electric bill, which is typically read by an automated or human meter reader. The CEPM 10 output, in one embodiment, will have a standard format that will include more information than modem 8-10 digit numbers. Encoding strategies, in one embodiment, will be able to use 8-10 ASCII characters instead of digits, to make it easy for manual meter reading. The ASCII characters may represent hexadecimal or other codes to compress more information into the same 8-10 characters. The number of characters is likely to be less important in the future as manual meter reading is replaced by bi-directional networked communication between the meters and the utilities.

Information in the meter message may include, for example, monthly usage for air conditioners, heaters, coffee makers, refrigerators, hot tubs, swimming pools, lighting, clocks, computers, ovens, ranges, hair dryers, curling irons, televisions, video game stations, hot water heaters, exercise equipment, etc. This information may be aggregated at the office level to compare peers in neighborhoods when searching for anomalies. For example, if there are ten houses in a neighborhood, and nine of the houses have an AC cost of $30 per month and one house has a cost of $200 per month, the consumer with the $200 cost should have their AC unit checked.

Further, if consumers see that they are using two times the national average energy consumption, they may set targets for themselves to conserve energy in order to be a better global citizen.

A consumer bill may also include data from last month and last year for the same time period. This should help to identify trends in energy consumption and degradation of appliances. A refrigerator or any other appliance, for example, may use significantly more electricity if it is not properly maintained.

Further, consumers may want a local wired or wireless interface into their cognitive meter through a web browser type application in addition to the standard utility interface.

In summary explanation, a cognitive electric power meter has embedded intelligence to decompose one measured load signal into its constituents. The cognitive electric power meter uses model based embedded intelligence to decompose the power signal that is already measured at the incoming meter into its constituent individual loads and provides a usage summary to the consumer with no in home field installation cost. The cognitive electric power meter functionality is implemented, according to one embodiment, in the residential electric power meter.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. An electric power meter comprising:

at least one sensor configured to measure at least one desired energy consumption variable associated with a plurality of energy consumption devices, and to generate at least one output signal therefrom; and a decomposition module configured to decompose the at least one output signal into constituent individual loads and therefrom identify energy consumption corresponding to each energy consumption device within the plurality of energy consumption devices, wherein the decomposition module comprises a cognitive decomposition algorithm configured to store knowledge and learn, continuously adapting to changes in household power line characteristics to improve power line monitoring and energy consumption device control capabilities, and further wherein the decomposition algorithm employs invariant representation and associative processing to implement its learning.

2. The electric power meter according to claim 1, wherein the at least one sensor is selected from a current sensor, a voltage sensor, a temperature sensor, an activity sensor, and an acoustic sensor.

3. The electric power meter according to claim 1, further comprising a communication interface configured for receiving user commands and queries and for transmitting decomposition results.

4. The electric power meter according to claim 3, wherein the communication interface is selected from wired and wireless communication technologies.

5. The electric power meter according to claim 3, wherein the communication interface is selected from RSb232, USB, Firewire, Ethernet, Zigbee, Wifi, Bluetooth, RFJID, wireless USB, cellular, and WMAN communication technologies.

6. The electric power meter according to claim 1, wherein the decomposition module is further configured to perform a cognitive cycle to a) determine the instantaneous state of a power line, b) perform grid scene analysis based on the instantaneous state to identify individual and combined load signatures of power consuming devices coupled to the power line, c) predict future power grid behavior of individual and combined power consuming devices coupled to the power line, d) create a decision about the state of the power line based on the future power grid behavior, and e) perform a desired energy preservation act based on the decision.

7. The electric power meter according to claim 1, wherein the decomposition algorithm uses a Bayesian-inference based classifier configured to identify energy consumption devices on a household power line.

8. The electric power meter according to claim 1, further comprising a communication interface configured to communicate directly with smart appliances over a power line carrier or a wireless communication link.

9. The electric power meter according to claim 1, wherein the decomposition module is integrated into a revenue metering portion of the electric power meter to form a portion of an intelligent billing system within the electric power meter.

10. The electric power meter according to claim 9, wherein the intelligent billing system is configured to link washing, air conditioning and dishwashing activities to time of use pricing based on data generated by the decomposition module.

11. The electric power meter according to claim 9, wherein the intelligent billing system is configured to identify an appliance that is using more energy than the national average energy usage for the appliance based on data generated by the decomposition module.

12. The electric power meter according to claim 9, wherein the intelligent billing system is configured to identify a wiring flaw within a home using the electric power meter based on data generated by the decomposition module.

13. An electric power meter comprising:

at least one sensor configured to measure at least one desired energy consumption variable associated with a plurality of energy consumption devices, and to generate at least one output signal therefrom; and a decomposition module configured to decompose the at least one output signal into constituent individual loads and therefrom identify energy consumption corresponding to each energy consumption device within the plurality of energy consumption devices, wherein the decomposition module comprises a cognitive decomposition algorithm configured to store knowledge and learn, continuously adapting to changes in household power line characteristics to improve power line monitoring and energy consumption device control capabilities, and further wherein the decomposition algorithm is aggregated in a multidimensional associative array that is segmented based on the particular element of the cognitive cycle it supports.

14. The electric power meter according to claim 13, wherein the at least one sensor is selected from a current sensor, a voltage sensor, a temperature sensor, an activity sensor, and an acoustic sensor.

15. The electric power meter according to claim 13, further comprising a communication interface configured for receiving user commands and queries and for transmitting decomposition results.

16. The electric power meter according to claim 15, wherein the communication interface is selected from wired and wireless communication technologies.

17. The electric power meter according to claim 15, wherein the communication interface is selected from RSb232, USB, Firewire, Ethernet, Zigbee, Wifi, Bluetooth, RFJID, wireless USB, cellular, and WMAN communication technologies.

18. The electric power meter according to claim 13, wherein the decomposition module is further configured to perform a cognitive cycle to a) determine the instantaneous state of a power line, b) perform grid scene analysis based on the instantaneous state to identify individual and combined load signatures of power consuming devices coupled to the power line, c) predict future power grid behavior of individual and combined power consuming devices coupled to the power line, d) create a decision about the state of the power line based on the future power grid behavior, and e) perform a desired energy preservation act based on the decision.

19. The electric power meter according to claim 13, wherein the decomposition algorithm uses a Bayesian-inference based classifier configured to identify energy consumption devices on a household power line.

20. An electric power meter comprising:

at least one sensor configured to measure at least one desired energy consumption variable associated with a plurality of energy consumption devices, and to generate at least one output signal therefrom; and a decomposition module configured to decompose the at least one output signal into constituent individual loads and therefrom identify energy consumption corresponding to each energy consumption device within the plurality of energy consumption devices, wherein the decomposition module comprises a cognitive decomposition algorithm configured to identify, without requiring field training, energy consumption devices on a household power line.

21. The electric power meter according to claim 20, wherein the at least one sensor is selected from a current sensor, a voltage sensor, a temperature sensor, an activity sensor, and an acoustic sensor.

22. The electric power meter according to claim 20, further comprising a communication interface configured for receiving user commands and queries and for transmitting decomposition results.

23. The electric power meter according to claim 22, wherein the communication interface is selected from wired and wireless communication technologies.

24. The electric power meter according to claim 22, wherein the communication interface is selected from RS232, USB, Firewire, Ethernet, Zigbee, Wifi, Bluetooth, RFJID, wireless USB, cellular, and WMAN communication technologies.

25. The electric power meter according to claim 20, wherein the decomposition module is further configured to perform a cognitive cycle to a) determine the instantaneous state of a power line, b) perform grid scene analysis based on the instantaneous state to identify individual and combined load signatures of power consuming devices coupled to the power line, c) predict future power grid behavior of individual and combined power consuming devices coupled to the power line, d) create a decision about the state of the power line based on the future power grid behavior, and e) perform a desired energy preservation act based on the decision.

26. The electric power meter according to claim 20, wherein the decomposition algorithm uses a Bayesian-inference based classifier configured to identify energy consumption devices on a household power line.

27. A method of decomposing a household power meter signal, the method comprising:

measuring a household meter power line signal;

decomposing within the household power meter, the power line signal into constituent individual loads; and identifying within the household power meter, energy consumption corresponding to each individual load within a plurality of loads that operate together to generate the household meter power line signal;

storing knowledge and learning, based on the measuring, decomposing and identifying, and continuously adapting to changes in household power line characteristics to improve power line monitoring and energy consumption device control capabilities, wherein the learning is based on invariant representation and associative processing techniques.

28. The method according to claim 27, wherein decomposing the power line signal into constituent individual loads comprises:

determining the instantaneous state of the power line; and performing grid scene analysis based on the instantaneous state to identify individual and combined load signatures of power consuming devices coupled to the power line.

29. The method according to claim 27, wherein identifying energy consumption corresponding to each individual load within a plurality of loads comprises:

predicting future power grid behavior of individual and combined power consuming devices coupled to the power line;

creating a decision about the state of the power line based on the future power grid behavior; and performing a desired energy preservation act based on the decision.

30. The method according to claim 27, wherein the measuring, decomposing and identifying comprises configuring a Bayesian-inference based classifier to identify energy consumption devices on the household power line.

31. The method according to claim 27, further comprising communicating directly with smart appliances over a power line carrier or a wireless communication link to identify individual smart appliances contributing to the household meter power line signal.

32. The method according to claim 27, further comprising identifying within a revenue metering portion of the household power meter, energy consumption corresponding to each individual load within a plurality of loads, to form a portion of an intelligent billing system within the electric power meter.

33. The method according to claim 32, further comprising linking washing, air conditioning and dishwashing activities to time of use pricing based on data generated by the revenue metering portion of the household power meter.

34. The method according to claim 32, further comprising identifying an appliance that is using more energy than the national average energy usage for the appliance based on data generated by the revenue metering portion of the household power meter.

35. The method according to claim 32, further comprising identifying a wiring flaw within a home using the electric power meter based on data generated by the revenue metering portion of the household power meter.

36. A method of decomposing a household power meter signal, the method comprising:

measuring a household meter power line signal;

decomposing within the household power meter, the power line signal into constituent individual loads; and identifying within the household power meter, energy consumption corresponding to each individual load within a plurality of loads that operate together to generate the household meter power line signal; and storing knowledge and learning, based on the measuring, decomposing and identifying, and continuously adapting to changes in household power line characteristics to improve power line monitoring and energy consumption device control capabilities, wherein storing knowledge comprises aggregating a multidimensional associative array that is segmented based on a particular element of a desired cognitive cycle.

37. The method according to claim 36, wherein decomposing the power line signal into constituent individual loads comprises:

determining the instantaneous state of the power line; and performing grid scene analysis based on the instantaneous state to identify individual and combined load signatures of power consuming devices coupled to the power line.

38. The method according to claim 36, wherein identifying energy consumption corresponding to each individual load within a plurality of loads comprises:

predicting future power grid behavior of individual and combined power consuming devices coupled to the power line;

creating a decision about the state of the power line based on the future power grid behavior; and performing a desired energy preservation act based on the decision.

39. The method according to claim 36, wherein the measuring, decomposing and identifying comprises configuring a Bayesian-inference based classifier to identify energy consumption devices on the household power line.

40. The method according to claim 36, further comprising communicating directly with smart appliances over a power line carrier or a wireless communication link to identify individual smart appliances contributing to the household meter power line signal.

41. The method according to claim 36, further comprising identifying within a revenue metering portion of the household power meter, energy consumption corresponding to each individual load within a plurality of loads, to form a portion of an intelligent billing system within the electric power meter.

42. The method according to claim 41, further comprising linking washing, air conditioning and dishwashing activities to time of use pricing based on data generated by the revenue metering portion of the household power meter.

43. The method according to claim 41, further comprising identifying an appliance that is using more energy than the national average energy usage for the appliance based on data generated by the revenue metering portion of the household power meter.

44. The method according to claim 41, further comprising identifying a wiring flaw within a home using the electric power meter based on data generated by the revenue metering portion of the household power meter.

45. A method of decomposing a household power meter signal, the method comprising:

measuring a household meter power line signal;

decomposing within the household power meter, the power line signal into constituent individual loads; and identifying within the household power meter, energy consumption corresponding to each individual load within a plurality of loads that operate together to generate the household meter power line signal, wherein the identifying comprises identifying, without requiring field training, energy consumption devices on a household power line.

46. The method according to claim 45, wherein decomposing the power line signal into constituent individual loads comprises:

determining the instantaneous state of the power line; and performing grid scene analysis based on the instantaneous state to identify individual and combined load signatures of power consuming devices coupled to the power line.

47. The method according to claim 45, wherein identifying energy consumption corresponding to each individual load within a plurality of loads comprises:

predicting future power grid behavior of individual and combined power consuming devices coupled to the power line;

creating a decision about the state of the power line based on the future power grid behavior; and performing a desired energy preservation act based on the decision.

48. The method according to claim 45, wherein the measuring, decomposing and identifying comprises configuring a Bayesian-inference based classifier to identify energy consumption devices on the household power line.

49. The method according to claim 45, further comprising communicating directly with smart appliances over a power line carrier or a wireless communication link to identify individual smart appliances contributing to the household meter power line signal.

50. The method according to claim 45, further comprising identifying within a revenue metering portion of the household power meter, energy consumption corresponding to each individual load within a plurality of loads, to form a portion of an intelligent billing system within the electric power meter.

51. The method according to claim 50, further comprising linking washing, air conditioning and dishwashing activities to time of use pricing based on data generated by the revenue metering portion of the household power meter.

52. The method according to claim 50, further comprising identifying an appliance that is using more energy than the national average energy usage for the appliance based on data generated by the revenue metering portion of the household power meter.

53. The method according to claim 50, further comprising identifying a wiring flaw within a home using the electric power meter based on data generated by the revenue metering portion of the household power meter.

54. An electric power meter comprising an embedded decomposition module configured for decomposing a power signal into constituent loads to segregate and identify energy consumption associated with each individual energy consumption device within a plurality of energy consumption devices, wherein the decomposition module comprises a cognitive decomposition algorithm configured to store knowledge and learn, continuously adapting to changes in household power line characteristics to improve power line monitoring and energy consumption device control capabilities, wherein the decomposition algorithm comprises invariant representation and associative processing to implement its learning.

55. The electric power meter according to claim 54, wherein the cognitive decomposition algorithm is configured to perform a cognitive cycle that a) determines the instantaneous state of a power line, b) performs grid scene analysis based on the instantaneous state to identify individual and combined load signatures of power consuming devices coupled to the power line, c) predicts future power grid behavior of individual and combined power consuming devices coupled to the power line, d) creates a decision about the state of the power line based on the future power grid behavior, and e) performs a desired energy preservation act based on the decision.

56. The electric power meter according to claim 54, wherein the cognitive decomposition algorithm uses a Bayesian-inference based classifier configured to identify energy consumption devices on a household power line.

57. The electric power meter according to claim 54, further comprising a communication interface configured to communicate directly with smart appliances over a power line carrier or a wireless communication link.

58. The electric power meter according to claim 54, wherein the decomposition module is integrated into a revenue metering portion of the electric power meter to form a portion of an intelligent billing system within the electric power meter.

59. The electric power meter according to claim 58, wherein the revenue metering portion is configured to link washing, air conditioning and dishwashing activities to time of use pricing based on data generated by the decomposition module.

60. The electric power meter according to claim 58, wherein the revenue metering portion is configured to identify an appliance that is using more energy than the national average energy usage for the appliance based on data generated by the decomposition module.

61. The electric power meter according to claim 58, wherein the revenue metering portion is configured to identify a wiring flaw within a home using the electric power meter based on data generated by the decomposition module.

62. An electric power meter comprising an embedded decomposition module configured for decomposing a power signal into constituent loads to segregate and identify energy consumption associated with each individual energy consumption device within a plurality of energy consumption devices, wherein the decomposition module comprises a cognitive decomposition algorithm configured to store knowledge and learn, continuously adapting to changes in household power line characteristics to improve power line monitoring and energy consumption device control capabilities, wherein the decomposition algorithm is aggregated in a multidimensional associative array that is segmented based on the particular element of the cognitive cycle it supports.

63. The electric power meter according to claim 62, wherein the cognitive decomposition algorithm is configured to perform a cognitive cycle that a) determines the instantaneous state of a power line, b) performs grid scene analysis based on the instantaneous state to identify individual and combined load signatures of power consuming devices coupled to the power line, c) predicts future power grid behavior of individual and combined power consuming devices coupled to the power line, d) creates a decision about the state of the power line based on the future power grid behavior, and e) performs a desired energy preservation act based on the decision.

64. The electric power meter according to claim 62, wherein the cognitive decomposition algorithm uses a Bayesian-inference based classifier configured to identify energy consumption devices on a household power line.

65. The electric power meter according to claim 62, further comprising a communication interface configured to communicate directly with smart appliances over a power line carrier or a wireless communication link.

66. The electric power meter according to claim 62, wherein the decomposition module is integrated into a revenue metering portion of the electric power meter to form a portion of an intelligent billing system within the electric power meter.

67. The electric power meter according to claim 65, wherein the revenue metering portion is configured to link washing, air conditioning and dishwashing activities to time of use pricing based on data generated by the decomposition module.

68. The electric power meter according to claim 65, wherein the revenue metering portion is configured to identify an appliance that is using more energy than the national average energy usage for the appliance based on data generated by the decomposition module.

69. The electric power meter according to claim 65, wherein the revenue metering portion is configured to identify a wiring flaw within a home using the electric power meter based on data generated by the decomposition module.

70. An electric power meter comprising an embedded decomposition module configured for decomposing a power signal into constituent loads to segregate and identify energy consumption associated with each individual energy consumption device within a plurality of energy consumption devices, wherein the decomposition module comprises a cognitive decomposition algorithm configured to identify, without requiring field training, energy consumption devices on a household power line.

71. The electric power meter according to claim 70, wherein the cognitive decomposition algorithm is configured to perform a cognitive cycle that a) determines the instantaneous state of a power line, b) performs grid scene analysis based on the instantaneous state to identify individual and combined load signatures of power consuming devices coupled to the power line, c) predicts future power grid behavior of individual and combined power consuming devices coupled to the power line, d) creates a decision about the state of the power line based on the future power grid behavior, and e) performs a desired energy preservation act based on the decision.

72. The electric power meter according to claim 70, wherein the cognitive decomposition algorithm uses a Bayesian-inference based classifier configured to identify energy consumption devices on a household power line.

73. The electric power meter according to claim 70, further comprising a communication interface configured to communicate directly with smart appliances over a power line carrier or a wireless communication link.

74. The electric power meter according to claim 70, wherein the decomposition module is integrated into a revenue metering portion of the electric power meter to form a portion of an intelligent billing system within the electric power meter.

75. The electric power meter according to claim 74, wherein the revenue metering portion is configured to link washing, air conditioning and dishwashing activities to time of use pricing based on data generated by the decomposition module.

76. The electric power meter according to claim 74, wherein the revenue metering portion is configured to identify an appliance that is using more energy than the national average energy usage for the appliance based on data generated by the decomposition module.

77. The electric power meter according to claim 74, wherein the revenue metering portion is configured to identify a wiring flaw within a home using the electric power meter based on data generated by the decomposition module.

* * * * *